(12) United States Patent
Patel et al.

(10) Patent No.: US 11,927,624 B2
(45) Date of Patent: Mar. 12, 2024

(54) METHOD FOR MEASURING QUIESCENT CURRENT IN A SWITCHING VOLTAGE REGULATOR

(71) Applicant: TEXAS INSTRUMENTS INCORPORATED, Dallas, TX (US)

(72) Inventors: Harsh Patel, Bangalore (IN); Aalok Dyuti Saha, Bangalore (IN); Sanjeev Praphulla Chandra Nyshadham, Bangalore (IN); Subrato Roy, Bangalore (IN); Gaurav Kumar Mittal, Bangalore (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 2 days.

(21) Appl. No.: 17/846,397

(22) Filed: Jun. 22, 2022

(65) Prior Publication Data
US 2023/0417829 A1    Dec. 28, 2023

(30) Foreign Application Priority Data
Jun. 25, 2021 (IN) .............................. 202141028643

(51) Int. Cl.
*G01R 31/30* (2006.01)
*G01R 19/25* (2006.01)

(52) U.S. Cl.
CPC ..... *G01R 31/3008* (2013.01); *G01R 19/2506* (2013.01)

(58) Field of Classification Search
CPC .. G01R 31/002; G01R 31/26; G01R 31/2642; G01R 31/2648; G01R 31/2831; G01R 31/31702
See application file for complete search history.

(56) References Cited

U.S. PATENT DOCUMENTS

| | | | | |
|---|---|---|---|---|
| 5,721,495 A | * | 2/1998 | Jennion .............. | G01R 31/3004 324/762.02 |
| 2016/0124454 A1 | * | 5/2016 | Chellappa ................. | G05F 1/56 323/315 |

* cited by examiner

*Primary Examiner* — Tung X Nguyen
(74) *Attorney, Agent, or Firm* — Ronald O. Neerings; Frank D. Cimino (57) ABSTRACT

One example includes a method for measuring a quiescent current in a switching voltage regulator. The method includes generating a mathematical model of a circuit design associated with the switching voltage regulator. The mathematical model includes measurable parameters to describe a switching current of a power switch of the switching voltage regulator. The method also includes fabricating a circuit comprising the switching voltage regulator based on the circuit design. The fabricated circuit includes the power switch and conductive I/O. The method also includes coupling the conductive I/O of the fabricated circuit to a circuit test fixture and providing electrical signals to the conductive I/O via the circuit test fixture. The method also includes measuring the measurable parameters in response to the electrical signals and applying the measurable parameters to the mathematical model to calculate the switching current. The method further includes calculating the quiescent current based on the switching current.

20 Claims, 5 Drawing Sheets

METHOD FOR MEASURING QUIESCENT CURRENT IN A SWITCHING VOLTAGE REGULATOR

CROSS-REFERENCE TO RELATED APPLICATIONS

This application claims priority to Indian Provisional Patent Application No. 202141028643, filed 25 Jun. 2021, titled "INDUCTOR-LESS IQ MEASUREMENT DFT FOR BOOST CONTROLLERS", which is incorporated by reference herein in its entirety.

TECHNICAL FIELD

This description relates generally to electronic test systems, and more particularly to a method for measuring quiescent current in a switching voltage regulator.

BACKGROUND

A switching voltage regulator regulates an output voltage using an input voltage that may be any voltage within a specified range. A typical switching voltage regulator includes at least one power switch that switches to provide current through inductor. One performance parameter pertaining to a switching voltage regulator is quiescent current. Quiescent current is the current that flows through the switching voltage regulator to ground irrespective of any load current that may be present (or no load current). Quiescent current can therefore be undesired power consumption during operation and during non-operation of the switching voltage regulator. It may therefore be useful to have knowledge as to the amount of quiescent current that is exhibited by a switching voltage regulator. Measuring the quiescent current can be difficult, however, based on inaccuracies associated with measurements when the switching voltage regulator is not switching and based on time and/or component considerations when the switching voltage regulator is switching.

SUMMARY

One example includes a method for measuring a quiescent current in a switching voltage regulator. The method includes generating a mathematical model of a circuit design associated with the switching voltage regulator. The mathematical model includes measurable parameters to describe a switching current associated with a power switch of the switching voltage regulator. The method also includes fabricating a circuit comprising the switching voltage regulator based on the circuit design. The fabricated circuit includes the power switch and conductive inputs/outputs (I/O). The method also includes coupling the conductive I/O of the fabricated circuit to a circuit test fixture and providing electrical signals to the conductive I/O via the circuit test fixture. The method also includes measuring the measurable parameters in response to the electrical signals and applying the measurable parameters to the mathematical model to calculate the switching current. The method further includes calculating the quiescent current based on the switching current.

Another example described herein includes a method for measuring a quiescent current in a boost switching voltage regulator. The method includes generating a mathematical model of a circuit design associated with the boost switching voltage regulator. The mathematical model comprising measurable parameters to describe an average switching current and internal operational currents associated with a power switch of the boost switching voltage regulator. The method also includes fabricating a circuit comprising the boost switching voltage regulator based on the circuit design. The fabricated circuit comprising the power switch and conductive I/O. The method also includes coupling the conductive I/O of the fabricated circuit to a circuit test fixture and providing electrical signals to the conductive I/O via the circuit test fixture. The method also includes measuring the measurable parameters in response to the electrical signals and applying the measurable parameters to the mathematical model to calculate the average switching current. The method further includes calculating the quiescent current based on the average switching current and the internal operational currents associated with the mathematical model.

Another example described herein includes a method for measuring a quiescent current in a switching voltage regulator. The method includes generating a mathematical model of a circuit design associated with the switching voltage regulator. The mathematical model includes measurable parameters to describe an average switching current associated with a power switch of the switching voltage regulator. The measurable parameters include a peak switching current, a capacitor voltage, and internal operational currents of the switching voltage regulator. The method also includes fabricating a circuit comprising the switching voltage regulator based on the circuit design. The fabricated circuit includes the power switch, a first lead adapted to be coupled to an inductor, and a second lead adapted to be coupled to a capacitor. The method also includes coupling the first and second leads of the fabricated circuit to a circuit test fixture and providing electrical signals to the first and second leads via the circuit test fixture. The method also includes measuring the measurable parameters in response to the electrical signals and applying the measurable parameters to the mathematical model to calculate the average switching current. The method further includes calculating the quiescent current based on the average switching current and the internal operational currents associated with the mathematical model.

DETAILED DESCRIPTION

This description relates generally to electronic systems and, more particularly, to a method for measuring quiescent current in a switching voltage regulator. The method includes two main components. The first component includes generating a mathematical model of the switching voltage regulator based on a circuit design of the switching voltage regulator. The mathematical model can describe an aspect of the switching current of the switching voltage regulator. For example, the aspect of the switching current can be an average switching current of the switching voltage regulator during normal operation. The mathematical model can include variables that are measurable parameters of a fabricated circuit that includes the switching voltage regulator, and can thus be measured upon fabrication of the circuit via a circuit test fixture.

The second component includes measurement of the measurable parameters after fabrication of the switching voltage regulator. For example, the switching voltage regulator can be fabricated and can include the power switch and conductive inputs/outputs (I/O). The conductive I/O can be connected to the circuit test fixture, such that the circuit test fixture can provide electrical signals to the conductive I/O and can monitor voltages and currents associated with the conductive I/O. The I/O can include a first lead that is adapted to be coupled to an inductor and a second lead that is adapted to be coupled to a capacitor. As an example, the fabricated circuit can correspond to an integrated circuit (IC) die that includes at least the switching voltage regulator, such that the conductive I/O can correspond to conductive pads on the IC die that are connected to the circuit test fixture. As another example, the fabricated circuit can correspond to an IC package that includes at least the switching voltage regulator, such that the conductive I/O can correspond to conductive pins of the IC package that are connected to the circuit test fixture. The inductor and capacitor are therefore external to the fabricated circuit, and can be provided by an end user after the switching voltage regulator is fabricated and the quiescent current is measured. Thus, the first and second leads do not require coupling to the inductor and capacitor, respectively, to implement the measurement of the quiescent current.

The measured parameters can thus be provided to the mathematical model to obtain a fast and accurate measurement of the quiescent current of the switching voltage regulator in a manner that does not require coupling to external devices (e.g., the inductor and the capacitor). As provided herein, the switching voltage regulator is described as a boost switching voltage regulator. However, the principles and techniques described herein can apply to other types of switching voltage regulators.

Figure 1:
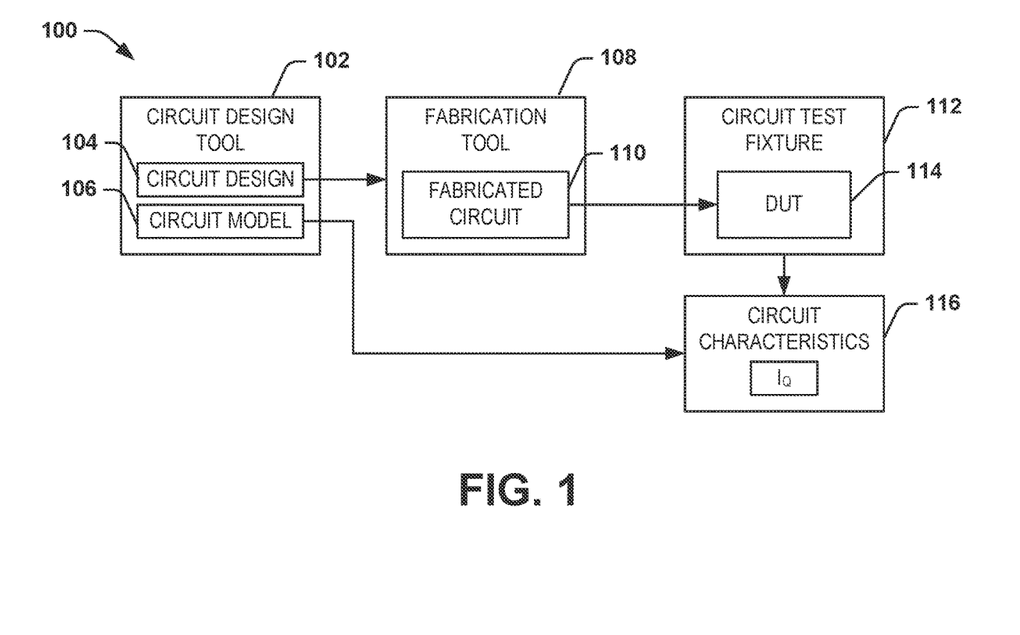
FIG. 1 is an example diagram of measuring the quiescent current of a switching voltage regulator.

FIG. 1 is a diagram 100 of measuring the quiescent current of a switching voltage regulator. The diagram 100 is demonstrated as including functional blocks that are representative of the steps and flow of how the quiescent current is measured for the switching voltage regulator. The diagram 100 includes a circuit design tool 102 that is configured to facilitate design of the switching voltage regulator by a user. The circuit design tool 102 is thus configured to generate a circuit design 104 that corresponds to the design of the switching voltage regulator. The circuit design tool 102 can correspond to a software program or a computer terminal on which the user can provide inputs to generate the circuit design 104. As an example, the circuit design 104 can be provided as a software file or set of files that describe the physical layout and/or operational characteristics of the switching voltage regulator.

The circuit design tool 102 also facilitates the creation of a mathematical model 106 of the switching voltage regulator, demonstrated as "CIRCUIT MODEL" 106. The mathematical model 106 can be a mathematical description of the switching voltage regulator that describes an aspect of the switching current of the switching voltage regulator during normal operation. As an example, the aspect of the switching current can be an average switching current of the switching voltage regulator during normal operation. As described in greater detail herein, the mathematical model 106 can describe the aspect of the switching current as a function of measurable parameters corresponding to parameters of the switching voltage regulator that can be measured upon fabrication.

The diagram 100 also includes a fabrication tool 108 that is configured to receive the circuit design 104 and to generate a fabricated circuit 110 that includes the switching voltage regulator. As an example, the fabrication tool 108 can be any of a variety of fabrication tools that can fabricate integrated circuits (ICs). The fabricated circuit 110 can include the switching voltage regulator, such as including a power switch and a set of conductive inputs/outputs (I/O) that can be conductively coupled to other devices or components in an associated circuit. As described herein, the fabricated circuit 110 can correspond to an IC die that includes at least the switching voltage regulator, such that the conductive I/O can correspond to conductive pads of the IC die, or can correspond to an IC package that includes at least the switching voltage regulator, such that the conductive I/O can correspond to conductive pins of the IC package. The conductive I/O can be adapted to be coupled to external components, such as provided by an end user. The external components can include any of a variety of circuit components, such as resistors, inductors, capacitors, etc., that can be coupled to the conductive I/O. The fabricated circuit 110 can be one of a plurality of fabricated circuits, such as arranged on a wafer.

The diagram 100 also includes a circuit test fixture 112 that can correspond to any of a variety of circuit testing devices that can probe and measure the conductive I/O of the fabricated circuit 110. In the example of FIG. 1, the fabricated circuit 110 is provided as a device-under-test (DUT) 114 to the circuit test fixture 112, such that the conductive I/O of the fabricated circuit 110 can be coupled to the conductive probes of the circuit test fixture 112. The circuit test fixture 112 can thus provide electrical signals to the DUT 114 to monitor voltages and currents at the conductive I/O of the DUT 114 to determine the measurable parameters of the fabricated circuit 110. For example, the application of the electrical signals can be provided during a design validation/verification stage of the fabricated circuit 110. The measurable parameters can thus be output as circuit characteristics 116. The output circuit characteristics 116 can be provided to a user terminal, such as a graphical user interface (GUI) of a computer or stored on any of a variety of different media.

In the example of FIG. 1, the mathematical model 106 is provided from the circuit design tool 102 to the output circuit characteristics 116. The output circuit characteristics 116 can thus be applied to the mathematical model 106 to provide for calculation of quiescent current $I_Q$, demonstrated at 118 in the example of FIG. 1, as described in greater detail below. The quiescent current $I_Q$ can thus be calculated based on the mathematical model 106 and the output circuit characteristics 116, as measured by the circuit test fixture 112. In this manner, the quiescent current $I_Q$ can be measured without the external components to which an end user couples to the fabricated circuit 110 (e.g., the inductor and/or the capacitor), as opposed to typical methods of measuring quiescent current. Furthermore, the measurement of the quiescent current $I_Q$, as described herein, can be more accurate and more rapid than typical methods of measuring quiescent current. As an example, typical methods can measure the quiescent current without switching the power switch, which can be rapid but very inaccurate, or can measure the quiescent current while switching the power switch by sampling the current over many cycles, which can be more accurate but very slow. Thus, the method of measuring the quiescent current described herein can be more accurate and more rapid than typical measurement methodologies.

Figure 2:
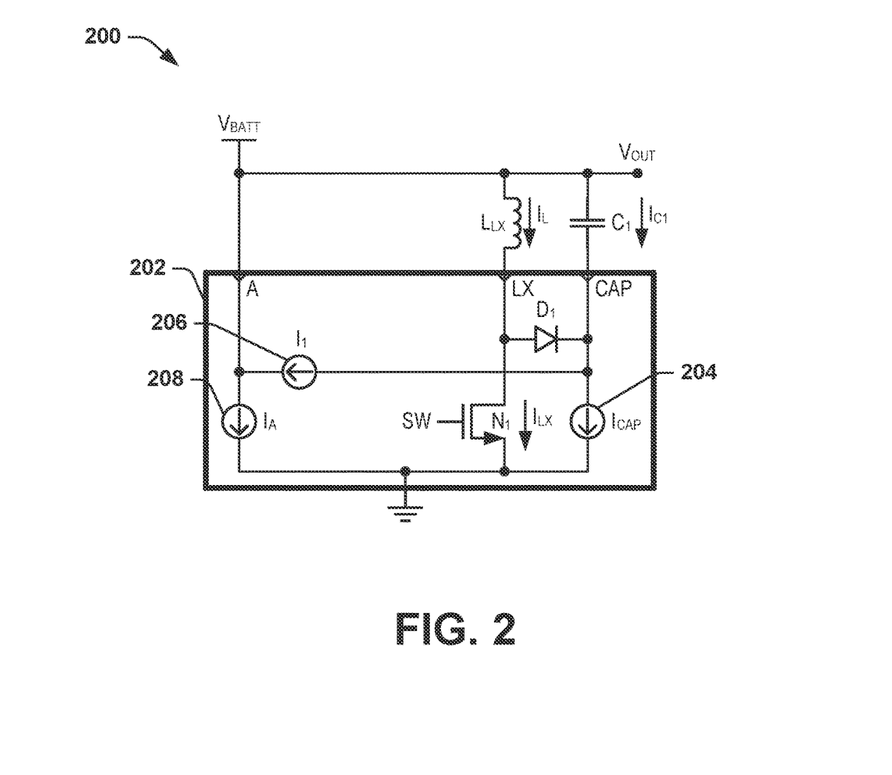
FIG. 2 is an example circuit diagram of a switching voltage regulator.

FIG. 2 is an example circuit diagram of a circuit 200. The circuit 200 can correspond to an end-user product that includes a fabricated circuit 202 and external components (e.g., provided by the end user), demonstrated as an inductor $L_{LX}$, a capacitor $C_1$, and a battery voltage $V_{BATT}$. In the example of FIG. 2, the circuit 200 is demonstrated as a boost regulator; however, other types of switching voltage regulators can be fabricated instead, for which the techniques to measure quiescent current can be equally applicable. The fabricated circuit 202 can correspond to the fabricated circuit 110 in the example of FIG. 1, and can thus include the switching voltage regulator. Additionally, the fabricated circuit 202 can include additional circuitry that is associated with or related to operation of the switching voltage regulator, such as including one or more switching driver circuits. Therefore, reference is to be made to the example of FIG. 1 in the following description of the example of FIG. 2.

The circuit 200 can be designed using the circuit design tool 102. The resultant design can thus be fabricated to provide the fabricated circuit 202. The external inductor $L_{LX}$ is demonstrated as being coupled to an input LX and the external capacitor $C_1$ is demonstrated as being coupled to an input CAP. The battery voltage $V_{BATT}$ is demonstrated as being provided to an input A. The inputs LX, CAP, and A can all be a part of conductive I/O of the fabricated circuit 202 (e.g., conductive pads on an IC die or pins on an IC package). Additional I/O can be included on the fabricated circuit 202, but are not relevant to the following discussion.

The fabricated circuit 202 includes a variety of internal circuit components, most of which are omitted for the sake of simplicity in describing the fabricated circuit 202. The fabricated circuit 202 includes a diode $D_1$ that couples the input LX and the input CAP. In response to activation of the power switch $N_1$ by the switching signal SW, the power switch $N_1$ conducts a current $I_L$ through the inductor $L_{LX}$ as a switching current $I_L$ x. When the power switch $N_1$ is deactivated by the switching signal SW, the current $I_L$ instead flows through the diode $D_1$ to charge the capacitor $C_1$. Additionally, the fabricated circuit 202 includes internal operational currents represented by current sources. The internal operational currents include a current source 204 that conducts a current $I_{CAP}$ and a current source 206 that conducts a current $I_1$. The currents $I_{CAP}$ and $I_1$ collectively correspond to a current $I_{C1}$ provided by the capacitor $C_1$. The internal operational currents also include a current source 208 that conducts a current $I_A$. The current $I_A$ corresponds to a sum of the current $I_1$ and a current provided by the battery voltage $V_{BATT}$.

The circuit design tool 102 can be implemented to generate a mathematical model of the circuit 200. The mathematical model can be expressed as a function of measurable parameters of the circuit 200. For example, the mathematical model can be expressed as follows:

$$I_{LX,avg.} = (I_{cap} + I_1)\left(\frac{V_{cap_{low}} + V_{cap_{high}}}{2 \times VBATT} - 1\right) + \frac{Losses}{VBATT} \quad \text{Equation 1}$$

Where: $I_{LX,avg.}$ is the average switching current through the power switch of the switching voltage regulator;

$V_{cap_{low}}$ corresponds to a minimum threshold voltage of the capacitor $C_1$;

$V_{cap_{high}}$ corresponds to a maximum threshold voltage of the capacitor $C_1$; and Losses corresponds to an average current corresponding to losses in the diode $D_1$, the power switch $N_1$, and the inductor $L_{LX}$.

Providing the Losses as a function of the LSR of the inductor $L_{LX}$ and the on-resistance of the power switch $N_1$, the mathematical model can thus describe the average switching current to be expressed as a function of the battery voltage $V_{BATT}$, the inductor $L_{LX}$, the capacitor $C_1$, a peak switching current $I_{PEAK}$, the capacitor voltage $V_{CAP}$, and the currents $I_I$ and $I_{CAP}$. As a result, the function of the average switching current $I_{LX,avg.}$ can be expressed as follows:

$$I_{LX,avg.} = f(V_{BATT}, L_{LX}, C_1, I_{PEAK}, V_{CAPHIGH}, V_{CAPLOW}, I_1, I_{CAP}) \quad \text{Equation 2}$$

Equation 2 is used hereinafter as an expression to represent Equation 1 for purposes of calculating the average switching current $I_{LX,avg.}$.

Figure 3:
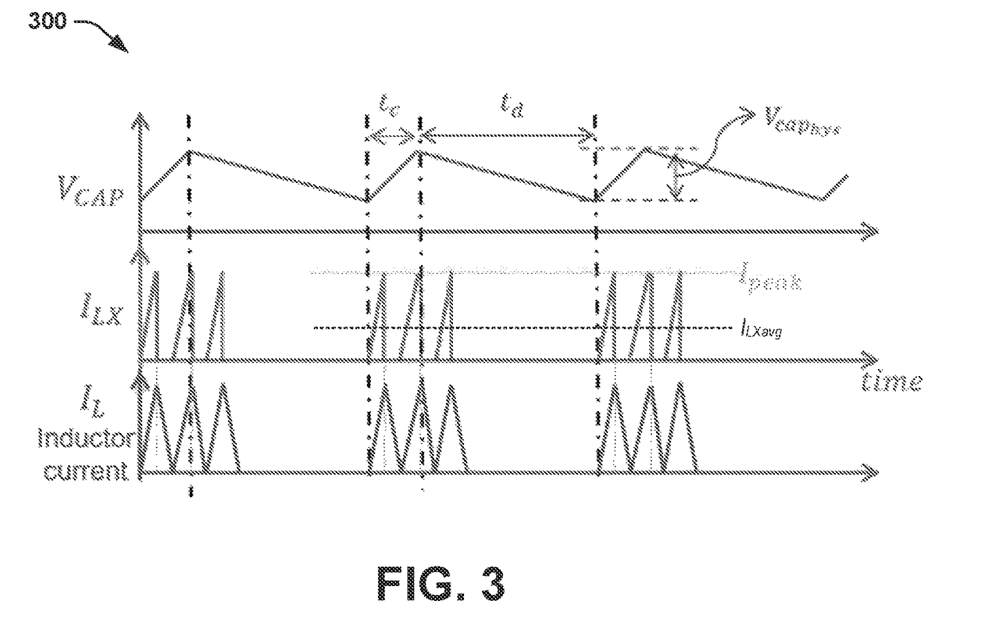
FIG. 3 is an example of a timing diagram.

FIG. 3 is an example of a timing diagram 300. The timing diagram 300 demonstrates signals that describe operation of the circuit 200. The timing diagram 300 demonstrates the capacitor voltage $V_{CAP}$, the switching current $I_{LX}$, and the inductor current $I_L$ over time. Because the timing diagram 300 demonstrates signals associated with operation of the circuit 200, reference is to be made to the example of FIG. 2 in the following description of the example of FIG. 3.

The voltage $V_{CAP}$ is demonstrated as increasing from the minimum magnitude $V_{CAPLOW}$ to the maximum threshold magnitude $V_{CAPHIGH}$ during a charging time $t_c$, and decreasing from the maximum threshold magnitude $V_{CAPHIGH}$ to the minimum threshold magnitude $V_{CAPLOW}$ during a discharging time $t_d$. In the example of FIG. 3, the difference between the maximum threshold magnitude $V_{CAPHIGH}$ and the minimum threshold magnitude $V_{CAPLOW}$ of the capacitor voltage $V_{CAP}$ is demonstrated as a voltage $V_{CAPhys}$. The increase of the voltage $V_{CAP}$ thus corresponds to deactivation of the power switch $N_1$, as indicated by the approximately zero magnitude of the switching current $I_{LX}$ and the corresponding decrease of the inductor current $I_L$. Thus, during the increase of the voltage $V_{CAP}$, the inductor current $I_L$ is provided to the capacitor $C_1$ through the diode $D_1$ to charge the capacitor $C_1$. The switching current $I_{LX}$ increases from approximately zero amps to the peak switching current during each switching cycle. Between the zero amp and peak switching current magnitude, the timing diagram 300 also demonstrates the average switching current $I_{LX,avg.}$.

Figure 4:
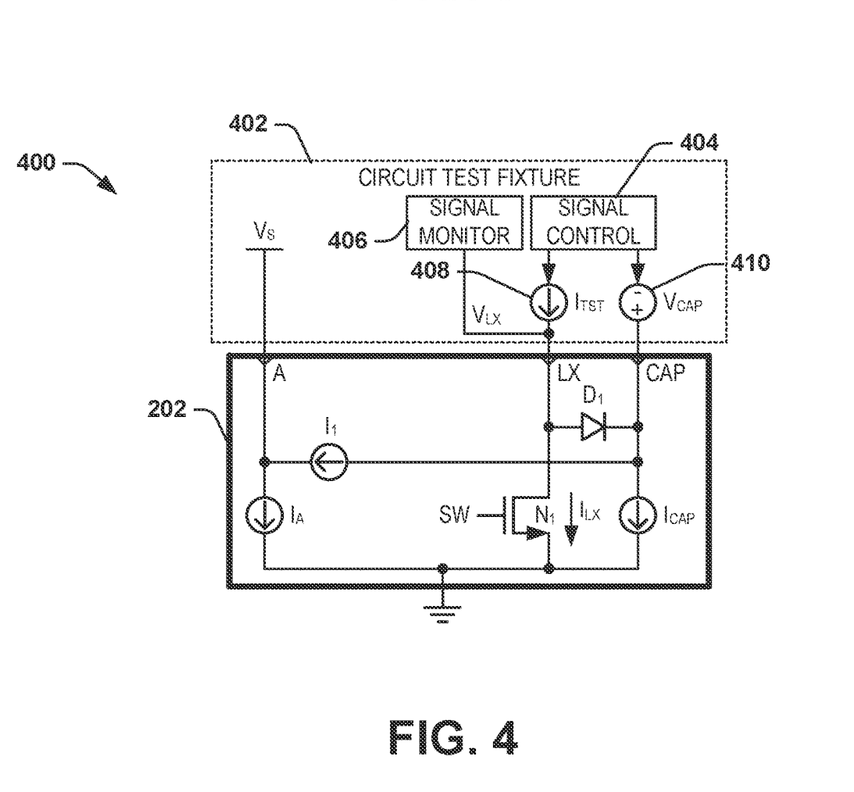
FIG. 4 is an example diagram of measuring parameters of a switching voltage regulator.

FIG. 4 is an example diagram 400 of measuring parameters of a switching voltage regulator. The diagram 400 includes the fabricated circuit 202 and a circuit test fixture 402. The circuit test fixture 402 can correspond to the circuit test fixture 112 in the example of FIG. 1. Therefore, reference is to be made to the examples of FIGS. 1-3 in the following description of the example of FIG. 4.

The circuit test fixture 402 can be configured to couple to the conductive I/O of the fabricated circuit 202 to provide electrical signals and to measure voltages and/or currents on the respective conductive I/O. In the example of FIG. 4, the circuit test fixture 402 includes a signal controller ("SIGNAL CONTROL") 404 and a signal monitor 406. The signal controller 404 is configured to control a signal source 408 that provides a current $I_{TST}$ to the input LX and a signal source 410 that provides a voltage $V_{CAP}$ to the input CAP.

The signal source 408 is demonstrated as a current source and the signal source 410 is demonstrated as a voltage source. However, the signal sources 408 and 410 can provide functionality as both current and voltage sources, as described herein. The signal monitor 406 is configured to monitor a current and a voltage at the input LX. In addition, the circuit test fixture 402 is configured to provide a static voltage VS at the inputs A and C. Based on this configuration, a variety of measurable parameters of the fabricated circuit 202 can be measured, as described in greater detail below.

Figure 5:
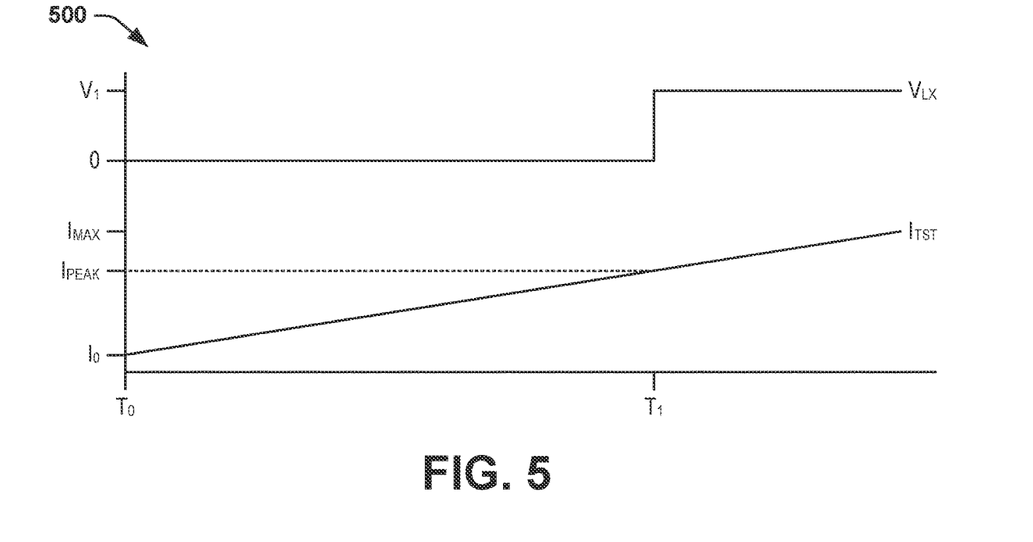
FIG. 5 is another example of a timing diagram.

As a first example, the peak switching current $I_{PEAK}$ can be measured. FIG. 5 is another example of a timing diagram 500. The timing diagram 500 demonstrates the current $I_{TST}$ and a voltage $V_{LX}$ at the input LX plotted as a function of time. The timing diagram 500 can correspond to a manner of measuring the peak switching current $I_{PEAK}$ via the circuit test fixture 402. Therefore, reference is to be made to the example of FIG. 4 in the following description of the example of FIG. 5.

To measure the peak switching current $I_{PEAK}$, the signal controller 404 can provide the current $I_{TST}$ as a current ramp and can monitor the voltage $V_{LX}$ at the input LX. At a time $T_0$, the current $I_{TST}$ begins to increase from a first magnitude $I_0$. After the time $T_0$, while the current $I_{TST}$ increases, the signal monitor 406 monitors the voltage $V_{LX}$. Initially, the voltage $V_{LX}$ has a magnitude of approximately zero volts, corresponding to an activated state of the power switch $N_1$, which thus indicates that the power switch $N_1$ conducts the switching current $I_{LX}$. At a time $T_1$, the voltage $V_{LX}$ increases from approximately zero volts to a voltage Vi. The increase in magnitude of the voltage $V_{LX}$ corresponds to deactivation of the power switch $N_1$ at the time $T_1$. Therefore, the magnitude of the current $I_{TST}$ at the time $T_1$ corresponds to the magnitude of the peak switching current $I_{PEAK}$. Accordingly, the peak switching current $I_{PEAK}$ is recorded as one of the measurable parameters in the output circuit characteristics 116.

Figure 6:
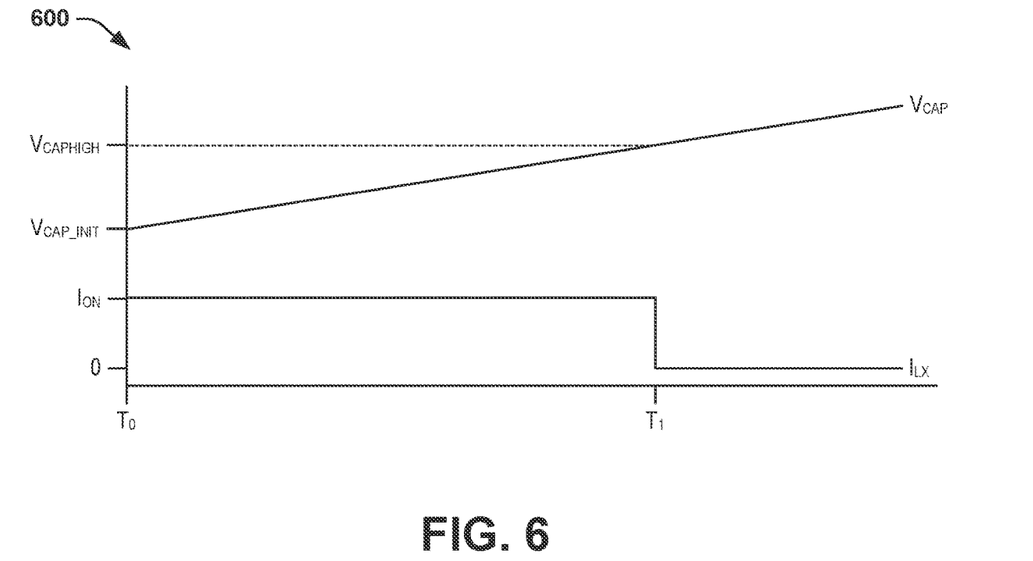
FIG. 6 is another example of a timing diagram.

As a second example, the maximum capacitor voltage $V_{CAPHIGH}$ can be measured. FIG. 6 is an example of a timing diagram 600. The timing diagram 600 demonstrates the voltage $V_{CAP}$ and the current $I_{LX}$ measured at the input LX plotted as a function of time. The timing diagram 600 demonstrates a manner of measuring the maximum capacitor voltage $V_{CAPHIGH}$ via the circuit test fixture 402. Therefore, reference is to be made to the example of FIG. 4 in the following description of the example of FIG. 6.

To measure the maximum capacitor voltage $V_{CAPHIGH}$, the signal controller 404 can provide the capacitor voltage $V_{CAP}$ as a ramp voltage with a positive slope and can monitor the switching current $I_{LX}$ at the input LX. At a time $T_0$, the capacitor voltage $V_{CAP}$ begins to increase from an initial magnitude $V_{CAP\_INIT}$. As an example, the initial magnitude $V_{CAP\_INIT}$ can be based on a ratio of the minimum and maximum capacitor voltages $V_{CAPLOW}$ and $V_{CAPHIGH}$, respectively, based on a ratio of a matched resistor in the design of the fabricated voltage regulator 202. For example, the initial magnitude $V_{CAP\_INIT}$ can be approximately 1.08 times an expected minimum capacitor voltage $V_{CAPLOW}$. After the time $T_0$, while the capacitor voltage increases, the signal monitor 406 monitors the switching current $I_{LX}$. Initially, the switching current $I_{LX}$ has a magnitude of $I_{ON}$, corresponding to an activated state of the power switch $N_1$, which thus indicates that the power switch $N_1$ is conducting the switching current $I_{LX}$. At a time $T_1$, the switching current $I_{LX}$ decreases from the magnitude $I_{ON}$ to approximately zero amps. The decrease in magnitude of the switching current $I_{LX}$ corresponds to deactivation of the power switch $N_1$ at the time $T_1$. Therefore, the magnitude of the capacitor voltage $V_{CAP}$ at the time $T_1$ corresponds to the magnitude of the maximum capacitor voltage $V_{CAPHIGH}$. Accordingly, the maximum capacitor voltage $V_{CAPHIGH}$ is recorded as one of the measurable parameters in the output circuit characteristics 116.

Figure 7:
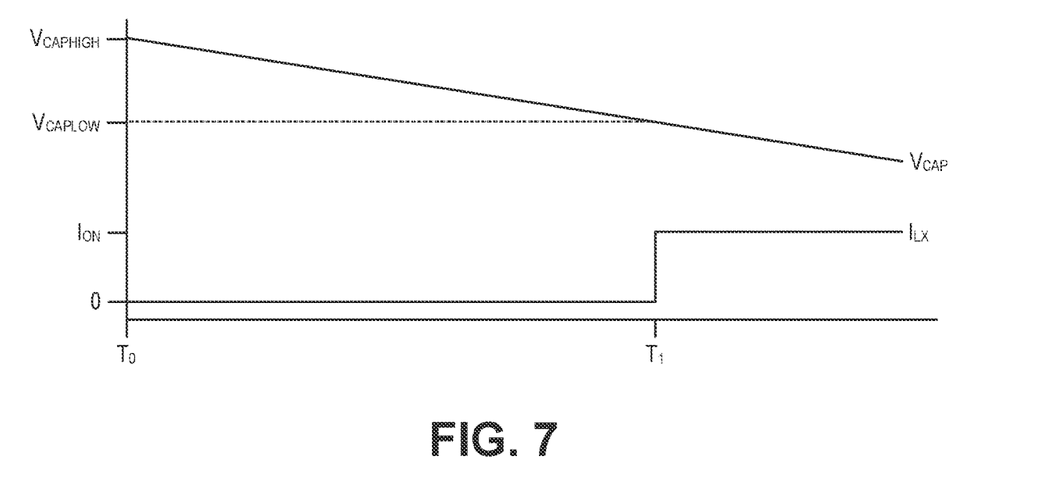
FIG. 7 is another example of a timing diagram.

As a third example, the minimum capacitor voltage $V_{CAPLOW}$ can be measured. FIG. 7 is an example of a timing diagram 700. The timing diagram 700 demonstrates the voltage $V_{CAP}$ and the current $I_{LX}$ measured at the input LX plotted as a function of time. The timing diagram 700 can correspond to a manner of measuring the peak switching current $I_{PEAK}$ via the circuit test fixture 402. Therefore, reference is to be made to the example of FIG. 4 in the following description of the example of FIG. 7.

To measure the minimum capacitor voltage $V_{CAPLOW}$, the signal controller 404 can provide the capacitor voltage $V_{CAP}$ as a negative ramp and can monitor the switching current $I_{LX}$ at the input LX. At a time $T_0$, the capacitor voltage $V_{CAP}$ begins to decrease from the maximum capacitor voltage magnitude $V_{CAPHIGH}$. After the time $T_0$, while the capacitor voltage decreases, the signal monitor 406 monitors the switching current $I_{LX}$. Initially, the switching current $I_{LX}$ has a magnitude of approximately zero amps, corresponding to a deactivated state of the power switch $N_1$, which thus indicates that the power switch $N_1$ is not conducting the switching current $I_{LX}$. At a time $T_1$, the switching current $I_{LX}$ increases from approximately zero amps to a magnitude $I_{ON}$. The increase in magnitude of the switching current $I_{LX}$ corresponds to activation of the power switch $N_1$ at the time $T_1$. Therefore, the magnitude of the capacitor voltage $V_{CAP}$ at the time $T_1$ corresponds to the magnitude of the minimum capacitor voltage $V_{CAPLOW}$. Accordingly, the minimum capacitor voltage $V_{CAPLOW}$ is recorded as one of the measurable parameters in the output circuit characteristics 116.

Figure 8:
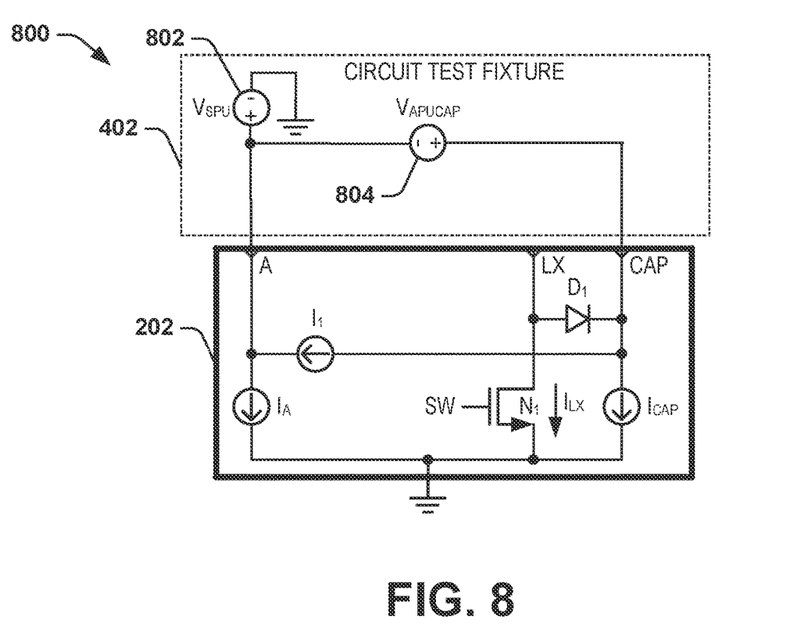
FIG. 8 is another example diagram of measuring parameters of a switching voltage regulator.

As a fourth example, the internal operational currents (e.g., $I_1$, $I_{CAP}$, and $I_A$) can be measured. FIG. 8 is another example diagram 800 of measuring parameters of a switching voltage regulator. The diagram 800 includes the fabricated circuit 202 and the circuit test fixture 402. However, the circuit test fixture 402 can be adjusted as to how the conductive I/O of the fabricated circuit 202 are connected to the circuit test fixture 402. In the example of FIG. 8, the circuit test fixture 402 provides a voltage $V_{SPU}$ to the input A via a voltage source 802 and provides a voltage $V_{APUCAP}$ to the input CAP via a voltage source 804. The voltage $V_{APUCAP}$ is provided with reference to the voltage $V_{SPU}$, such that the voltage at the input CAP is approximately equal to the voltage $V_{SPU}+V_{APUCAP}$.

By providing the voltages $V_{SPU}$ and $V_{APUCAP}$, the circuit test fixture 402 can determine the internal operational currents by measuring the current through the respective voltage sources 802 and 804 during application of the respective voltages $V_{SPU}$ and $V_{APUCAP}$. Based on the arrangement of the voltage sources 802 and 804, the internal operational currents can be expressed as follows:

$$I_{APUCAP}=I_1+I_{CAP} \quad \text{Equation 3}$$

$$I_{SPU}=I_4+I_{CAP} \quad \text{Equation 4}$$

Based on Equation 3 above, Equation 2 representing the mathematical model 106 can be rewritten as follows:

$$I_{LX,avg.}=f(V_{BATT}, L_{LX}, C_1, I_{PEAK}, V_{CAPHIGH}, V_{CAPLOW}, I_{APUCAP}) \quad \text{Equation 5}$$

The quiescent current $I_Q$ can be expressed as a sum of the internal operational currents and the average switching current $I_{LX,avg.}$. Based on the arrangement of the internal operational currents, the quiescent current $I_Q$ can thus be expressed as follows:

$$I_Q = I_A + I_{CAP} + I_{LX,avg.} \quad \text{Equation 6}$$

By substituting Equations 4 and 5 into Equation 6, Equation 6 can be rewritten as follows:

$$I_Q = I_{SPU} + f(V_{BATT}, L_{LX}, C_1, I_{PEAK}, V_{CAPHIGH}, V_{CAPLOW}, I_{APUCAP}) \quad \text{Equation 7}$$

Equation 7 can thus be implemented to calculate the quiescent current of the fabricated circuit 202.

Therefore, as described herein, the quiescent current $I_Q$ can be measured without the external components to which an end user couples to the fabricated circuit 202 (e.g., the inductor and/or the capacitor), as opposed to typical methods of measuring quiescent current. Furthermore, by implementing the mathematical model 106 and applying the measurable parameters to calculate the quiescent current $I_Q$, as described herein, the measurement of the quiescent current $I_Q$ can be more accurate than typical methods of measuring quiescent current that measure quiescent current without switching the power switch, and can be more rapid than typical methods of measuring quiescent current that measure quiescent current while switching the power switch by sampling the current over many cycles and then averaging. Accordingly, the measurement of quiescent current $I_Q$ described herein is more efficient than typical quiescent current measurement methods.

Figure 9:
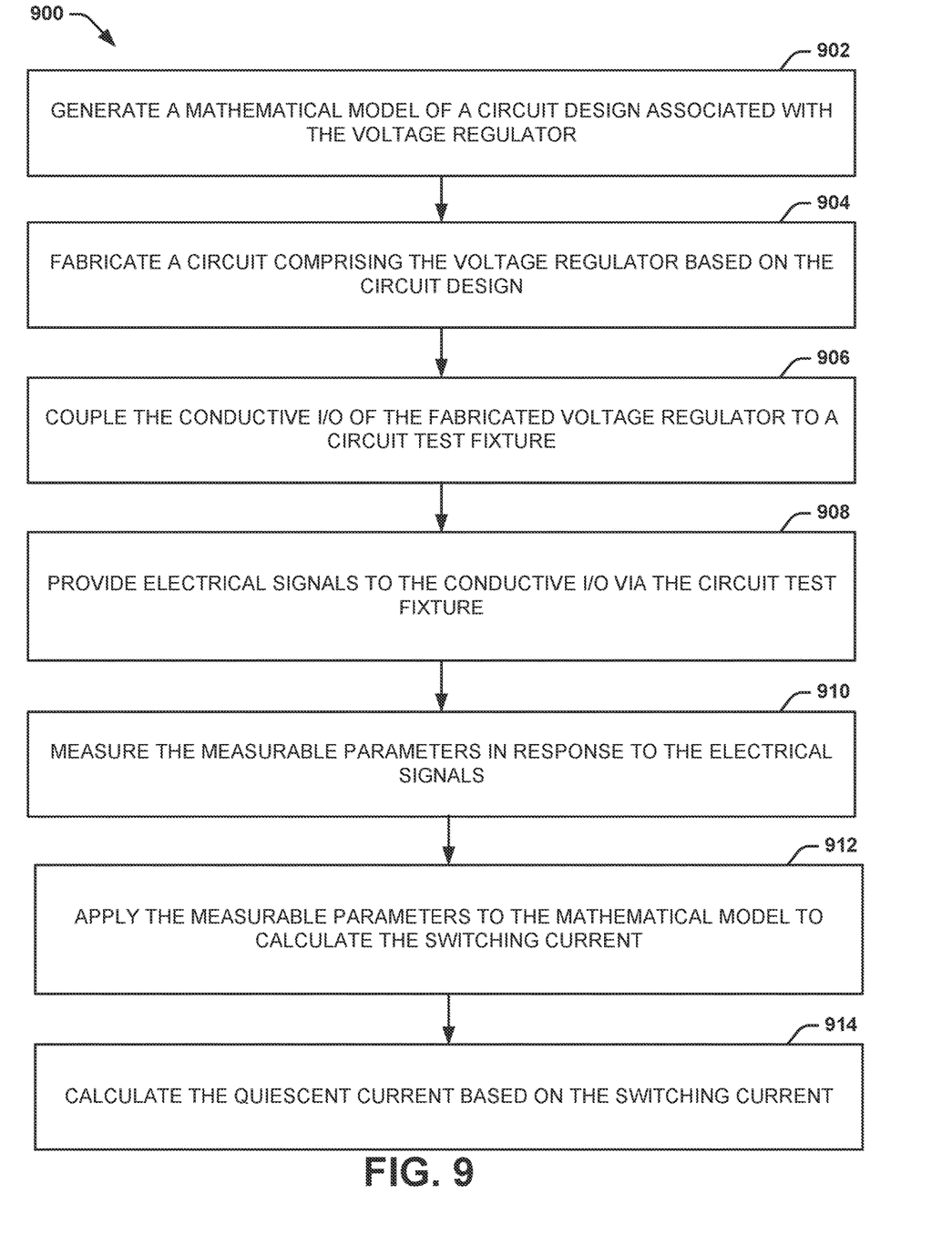
FIG. 9 is an example of a method for measuring a quiescent current in a switching voltage regulator.

In view of the foregoing structural and functional features described above, an example method will be better appreciated with reference to FIG. 9. While, for purposes of simplicity of explanation, the method is shown and described as executing serially, it is to be understood and appreciated that the method is not limited by the illustrated order, as parts of the method could occur in different orders and/or concurrently from that shown and described herein. Such method can be executed by various components configured in an integrated circuit, processor, or a controller, for example.

FIG. 9 illustrates an example of a method 900 for measuring a quiescent current (e.g., the quiescent current $I_Q$) in a switching voltage regulator (e.g., the circuit 200). At 902, a mathematical model (e.g., the mathematical model 106) of a circuit design (e.g., the circuit design 104) associated with the switching voltage regulator is generated. The mathematical model includes measurable parameters to describe a switching current (e.g., the average switching current $I_{LX,avg.}$) associated with a power switch (e.g., the power switch $N_1$) of the switching voltage regulator. At 904, a circuit comprising the switching voltage regulator is fabricated (e.g., the fabricated circuit 202) based on the circuit design. The fabricated circuit includes the power switch and conductive inputs/outputs (I/O) (e.g., the inputs LX, CAP, and A). At 906, the conductive I/O of the fabricated circuit are connected to a circuit test fixture (e.g., the circuit test fixture 402). At 908, electrical signals (e.g., the current $I_{TST}$, the voltage $V_{CAP}$, the voltages $V_{SPU}$ and $V_{APUCAP}$) are provided to the conductive I/O via the circuit test fixture. At 910, the measurable parameters are measured in response to the electrical signals. At 912, the measurable parameters are applied to the mathematical model to calculate the switching current. At 914, the quiescent current is calculated based on the switching current.

In this description, the term "couple" may cover connections, communications, or signal paths that enable a functional relationship consistent with this description. For example, if device A generates a signal to control device B to perform an action, then: (a) in a first example, device A is directly coupled to device B; or (b) in a second example, device A is indirectly coupled to device B through intervening component C if intervening component C does not substantially alter the functional relationship between device A and device B, so device B is controlled by device A via the control signal generated by device A.

Also, in this description, a device that is "configured to" perform a task or function may be configured (e.g., programmed and/or hardwired) at a time of manufacturing by a manufacturer to perform the function and/or may be configurable (or reconfigurable) by a user after manufacturing to perform the function and/or other additional or alternative functions. The configuring may be through firmware and/or software programming of the device, through a construction and/or layout of hardware components and interconnections of the device, or a combination thereof. Furthermore, a circuit or device described herein as including certain components may instead be configured to couple to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor wafer and/or integrated circuit (IC) package) and may be configured to couple to at least some of the passive elements and/or the sources to form the described structure, either at a time of manufacture or after a time of manufacture, such as by an end user and/or a third party.

The techniques described in this disclosure may also be embodied or encoded in an article of manufacture including a non-transitory computer-readable storage medium. Example non-transitory computer-readable storage media may include random access memory (RAM), read-only memory (ROM), programmable ROM, erasable programmable ROM, electronically erasable programmable ROM, flash memory, a solid-state drive, a hard disk, magnetic media, optical media, or any other computer readable storage devices or tangible computer readable media. The term "non-transitory" may indicate that the storage medium is not embodied in a carrier wave or a propagated signal. In certain examples, a non-transitory storage medium may store data that can, over time, change (e.g., in RAM or cache).

Modifications are possible in the described embodiments, and other embodiments are possible, within the scope of the claims.

What is claimed is:

1. A method for measuring a quiescent current in a switching voltage regulator, the method comprising:
generating a mathematical model of a circuit design associated with the switching voltage regulator, the mathematical model comprising measurable parameters to describe a switching current associated with a power switch of the switching voltage regulator;
fabricating a circuit comprising the switching voltage regulator based on the circuit design, the fabricated circuit comprising the power switch and conductive inputs/outputs (I/O);
coupling the conductive I/O of the fabricated circuit to a circuit test fixture;
providing electrical signals to the conductive I/O via the circuit test fixture;
measuring the measurable parameters in response to the electrical signals;

applying the measurable parameters to the mathematical model to calculate the switching current; and calculating the quiescent current based on the switching current.

2. The method of claim 1, wherein the mathematical model describes an average switching current associated with the switching voltage regulator.

3. The method of claim 1, wherein the conductive I/O comprises:
a first lead adapted to be coupled to an inductor; and
a second lead adapted to be coupled to a capacitor;
wherein measuring the measurable parameters comprises:
measuring a peak switching current based on the electrical signals provided to the first and second leads;
measuring a threshold associated with a capacitor voltage at the second lead based on the electrical signals provided to the first and second leads; and
measuring internal operational currents of the switching voltage regulator.

4. The method of claim 3, wherein providing the electrical signals comprises providing a current ramp to the first lead, wherein measuring the peak switching current comprises:
monitoring a switching voltage at the first lead to determine a change in the switching voltage indicative of deactivation of the power switch; and
measuring the peak switching current corresponding to a magnitude of the current ramp at which the power switch deactivates.

5. The method of claim 3, wherein providing the electrical signals comprises:
providing a voltage at a first magnitude at the second lead;
gradually increasing the voltage from the first magnitude at a positive slope ramp;
wherein measuring the peak switching current comprises:
monitoring a current at the first lead to determine deactivation of the power switch; and
measuring a maximum capacitor voltage corresponding to the voltage at the second lead in response to determining the deactivation of the power switch.

6. The method of claim 3, wherein providing the electrical signals comprises:
providing a voltage at a first magnitude at the second lead;
gradually decreasing the voltage from the first magnitude at a negative slope ramp;
wherein measuring the peak switching current comprises:
monitoring a current at the first lead to determine activation of the power switch; and
measuring a minimum capacitor voltage corresponding to the voltage at the second lead in response to determining the activation of the power switch.

7. The method of claim 3, wherein the conductive I/O further comprises a third lead adapted to be coupled to a supply voltage;
wherein providing the electrical signals comprises:
providing a first voltage at the third lead; and
providing a second voltage relative to the first voltage at the second lead;
wherein measuring internal operational currents of the switching voltage regulator comprises measuring the internal operational currents of the switching voltage regulator based on currents associated with each of the first and second voltages.

8. The method of claim 7, wherein calculating the quiescent current comprises calculating the quiescent current based on an average switching current and the internal operational currents associated with the mathematical model.

9. The method of claim 1, wherein the switching voltage regulator is a boost switching voltage regulator.

10. A method for measuring a quiescent current in a boost switching voltage regulator, the method comprising:
generating a mathematical model of a circuit design associated with the boost switching voltage regulator, the mathematical model comprising measurable parameters to describe an average switching current and internal operational currents associated with a power switch of the boost switching voltage regulator;
fabricating a circuit comprising the boost switching voltage regulator based on the circuit design, the fabricated circuit comprising the power switch and conductive inputs/outputs (I/O);
coupling the conductive I/O of the fabricated circuit to a circuit test fixture;
providing electrical signals to the conductive I/O via the circuit test fixture;
measuring the measurable parameters in response to the electrical signals;
applying the measurable parameters to the mathematical model to calculate the average switching current; and
calculating the quiescent current based on the average switching current and the internal operational currents associated with the mathematical model.

11. The method of claim 10, wherein the conductive I/O comprises:
a first lead adapted to be coupled to an inductor; and
a second lead adapted to be coupled to a capacitor;
wherein measuring the measurable parameters comprises:
measuring a peak switching current based on the electrical signals provided to the first and second leads;
measuring a threshold associated with a capacitor voltage at the second lead based on the electrical signals provided to the first and second leads; and
measuring internal operational currents of the switching voltage regulator.

12. The method of claim 11, wherein providing the electrical signals comprises providing a current ramp to the first lead, wherein measuring the peak average switching current comprises:
monitoring a switching voltage at the first lead to determine a change in the switching voltage indicative of deactivation of the power switch; and
measuring the peak average switching current corresponding to a magnitude of the current ramp at which the power switch deactivates.

13. The method of claim 11, wherein providing the electrical signals comprises:
providing a voltage at a first magnitude at the second lead;
gradually increasing the voltage from the first magnitude at a positive slope ramp;
wherein measuring the peak switching current comprises:
monitoring a current at the first lead to determine deactivation of the power switch; and
measuring a maximum capacitor voltage corresponding to the voltage at the second lead in response to determining the deactivation of the power switch.

14. The method of claim 11, wherein providing the electrical signals comprises:
providing a voltage at a first magnitude at the second lead;
gradually decreasing the voltage from the first magnitude at a negative slope ramp;
wherein measuring the peak switching current comprises:
monitoring a current at the first lead to determine activation of the power switch; and measuring a minimum capacitor voltage corresponding to the voltage at the second lead in response to determining the activation of the power switch.

15. The method of claim 11, wherein the conductive I/O further comprises a third lead adapted to be coupled to a supply voltage;
wherein providing the electrical signals comprises:
providing a first voltage at the third lead; and
providing a second voltage relative to the first voltage at the second lead;
wherein measuring internal operational currents of the switching voltage regulator comprises measuring the internal operational currents of the switching voltage regulator based on currents associated with each of the first and second voltages.

16. A method for measuring a quiescent current in a switching voltage regulator, the method comprising:
generating a mathematical model of a circuit design associated with the switching voltage regulator, the mathematical model comprising measurable parameters to describe an average switching current associated with a power switch of the switching voltage regulator, the measurable parameters comprising a peak switching current, a capacitor voltage, and internal operational currents of the switching voltage regulator;
fabricating a circuit comprising the switching voltage regulator based on the circuit design, the fabricated circuit comprising the power switch, a first lead adapted to be coupled to an inductor, and a second lead adapted to be coupled to a capacitor;
coupling the first and second leads of the fabricated circuit to a circuit test fixture;
providing electrical signals to the first and second leads via the circuit test fixture;
measuring the measurable parameters in response to the electrical signals;
applying the measurable parameters to the mathematical model to calculate the average switching current; and
calculating the quiescent current based on the average switching current and the internal operational currents associated with the mathematical model.

17. The method of claim 16, wherein providing the electrical signals comprises providing a current ramp to the first lead, wherein measuring the peak switching current comprises:
monitoring a switching voltage at the first lead to determine a change in the switching voltage indicative of deactivation of the power switch; and
measuring the peak switching current corresponding to a magnitude of the current ramp at which the power switch deactivates.

18. The method of claim 16, wherein providing the electrical signals comprises:
providing a voltage at a first magnitude at the second lead;
gradually increasing the voltage from the first magnitude at a positive slope ramp;
wherein measuring the peak switching current comprises:
monitoring a current at the first lead to determine deactivation of the power switch; and
measuring a maximum capacitor voltage corresponding to the voltage at the second lead in response to determining the deactivation of the power switch.

19. The method of claim 16, wherein providing the electrical signals comprises:
providing a voltage at a first magnitude at the second lead;
gradually decreasing the voltage from the first magnitude at a negative slope ramp;
wherein measuring the peak switching current comprises:
monitoring a current at the first lead to determine activation of the power switch; and
measuring a minimum capacitor voltage corresponding to the voltage at the second lead in response to determining the activation of the power switch.

20. The method of claim 16, wherein the fabricated circuit further comprises a third lead adapted to be coupled to a supply voltage;
wherein providing the electrical signals comprises:
providing a first voltage at the third lead; and
providing a second voltage relative to the first voltage at the second lead;
wherein measuring internal operational currents of the switching voltage regulator comprises measuring the internal operational currents of the switching voltage regulator based on currents associated with each of the first and second voltages.

* * * * *

UNITED STATES PATENT AND TRADEMARK OFFICE
CERTIFICATE OF CORRECTION

PATENT NO. : 11,927,624 B2
APPLICATION NO. : 17/846397
DATED : March 12, 2024
INVENTOR(S) : Harsh Patel et al.

Page 1 of 1

It is certified that error appears in the above-identified patent and that said Letters Patent is hereby corrected as shown below:

On the Title Page

Please correct Item (72) to reflect:
(72) Inventors: Harsh Patel, Bangalore (IN); A alok Dyuti Saha, Bangalore (IN); Sanjeev Praphulla Chandra Nyshadham, Bangalore (IN); Subrato R oy, Bangalore (IN); Gaurav Kumar Mittal, Bangalore (IN); Mayank Vashisht, Bangalore (IN)

Signed and Sealed this
Fourth Day of March, 2025

Coke Morgan Stewart
*Acting Director of the United States Patent and Trademark Office*